United States Patent [19]

Ortendahl et al.

[11] Patent Number: 5,085,219
[45] Date of Patent: Feb. 4, 1992

[54] ADJUSTABLE HOLDERS FOR MAGNETIC REASONANCE IMAGING RF SURFACE COIL

[75] Inventors: Douglas A. Ortendahl; Brenda G. Nichols, both of S. San Francisco; Ernesto Zepeda, Daly City; Matthias Gyori, Redwood City; Louis T. Kircos, Sausalito, all of Calif.

[73] Assignee: The Regents of the University of California, Berkeley, Calif.

[21] Appl. No.: 114,343

[22] Filed: Oct. 30, 1987

[51] Int. Cl.⁵ .............................................. A61B 5/055
[52] U.S. Cl. ................................. 128/653.5; 324/318
[58] Field of Search .............. 128/653; 324/309, 318, 324/320, 321; 378/39, 195, 196, 208, 901

[56] References Cited

U.S. PATENT DOCUMENTS

| | | | |
|---|---|---|---|
| 2,966,588 | 12/1960 | Kizaur | 378/196 |
| 3,025,397 | 3/1962 | Travis et al. | 376/208 |
| 3,927,326 | 12/1975 | Kunne et al. | 378/195 |
| 4,256,112 | 3/1981 | Kopf et al. | 128/303 B |
| 4,266,136 | 5/1981 | Duinker | 378/901 |
| 4,341,220 | 7/1982 | Perry | 128/630 |
| 4,403,289 | 9/1983 | Lux et al. | 378/901 |
| 4,463,758 | 8/1984 | Patil et al. | 128/303 B |
| 4,465,069 | 8/1984 | Barbier et al. | 128/303 B |
| 4,587,493 | 5/1986 | Sepponen | 324/318 |
| 4,592,352 | 6/1986 | Patil | 128/303 B |
| 4,608,977 | 9/1986 | Brown | 128/303 B |
| 4,821,729 | 4/1989 | Makofski et al. | 128/24 EL |

FOREIGN PATENT DOCUMENTS

| | | | |
|---|---|---|---|
| 2238706 | 2/1984 | Fed. Rep. of Germany | 378/196 |
| 3628035 | 8/1986 | Fed. Rep. of Germany | 324/318 |

*Primary Examiner*—Ruth S. Smith
*Attorney, Agent, or Firm*—Nixon & Vanderhye

[57] ABSTRACT

An adjustable holder for a magnetic resonance imaging RF surface coil for imaging a part of the body such as the temporomandibular joint. Elements are provided for positioning and securing the RF surface coil at a first predetermined point along a longitudinal axis of the holder and for positioning and securing the RF surface coil at a second predetermined point transverse to the longitudinal axis and at a radial distance R from the longitudinal axis. The preferred embodiment provides orbital movement of the surface coil about the longitudinal axis using a pair of U-shaped runner guides disposed substantially transverse to the longitudinal axis and adjustable clamps in cooperative engagement with the runner guides. The surface coil may be adjusted along a path transverse to the longitudinal axis by way of an adjustable shaft or arm which can be moved inwardly and outwardly, and the surface coil can be pivoted in a step-wise manner using a pivot head having a plurality of equally spaced detents. The pivot head is biased in a direction away from the surface coil and adjustably engages one of the plural detents while rotating about an axis substantially parallel to the longitudinal axis.

19 Claims, 8 Drawing Sheets

FIG. 6
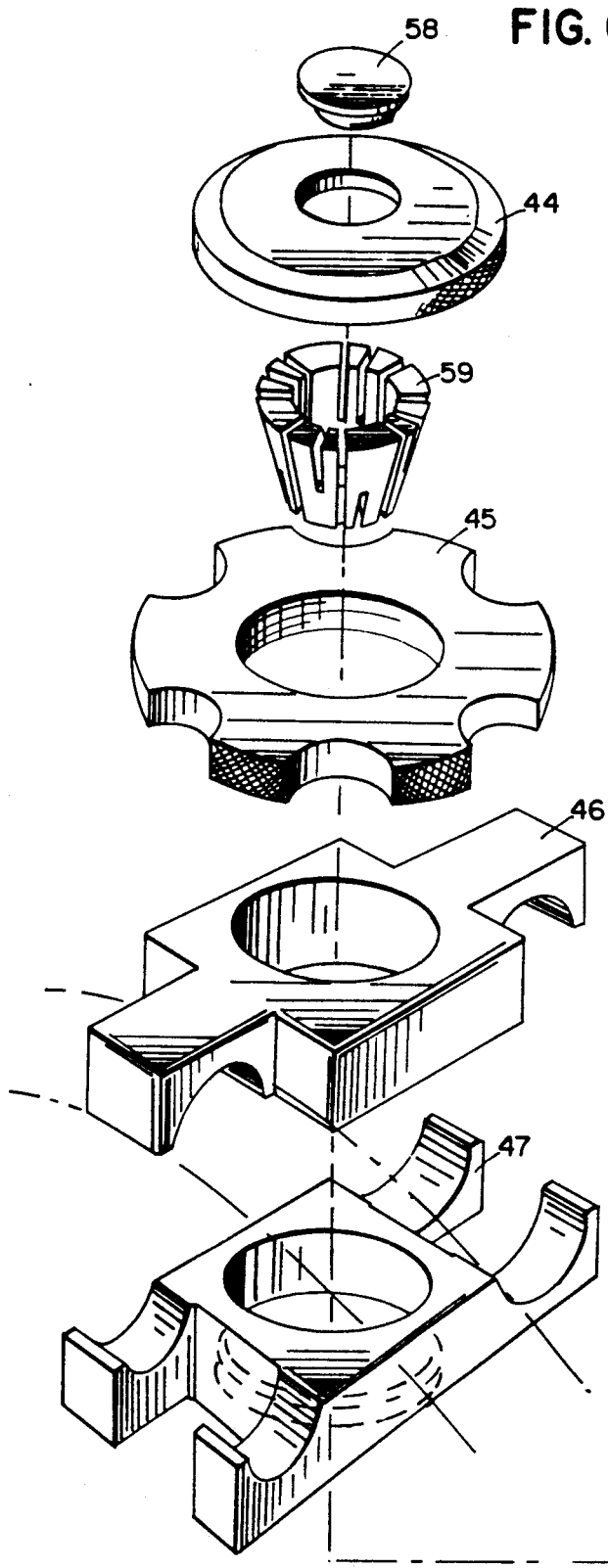
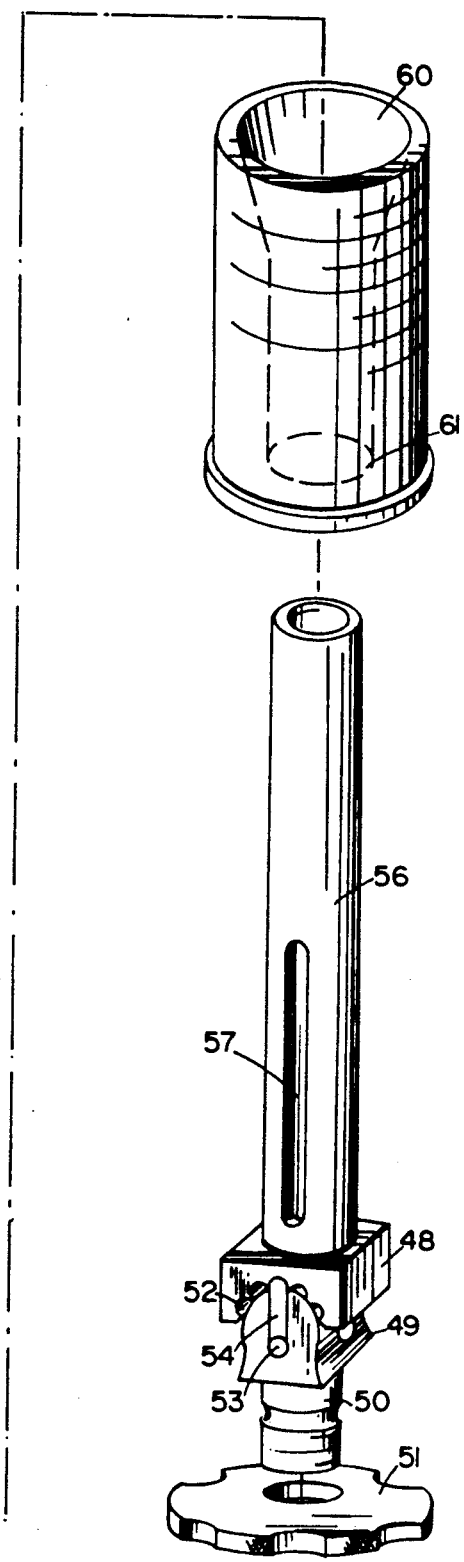

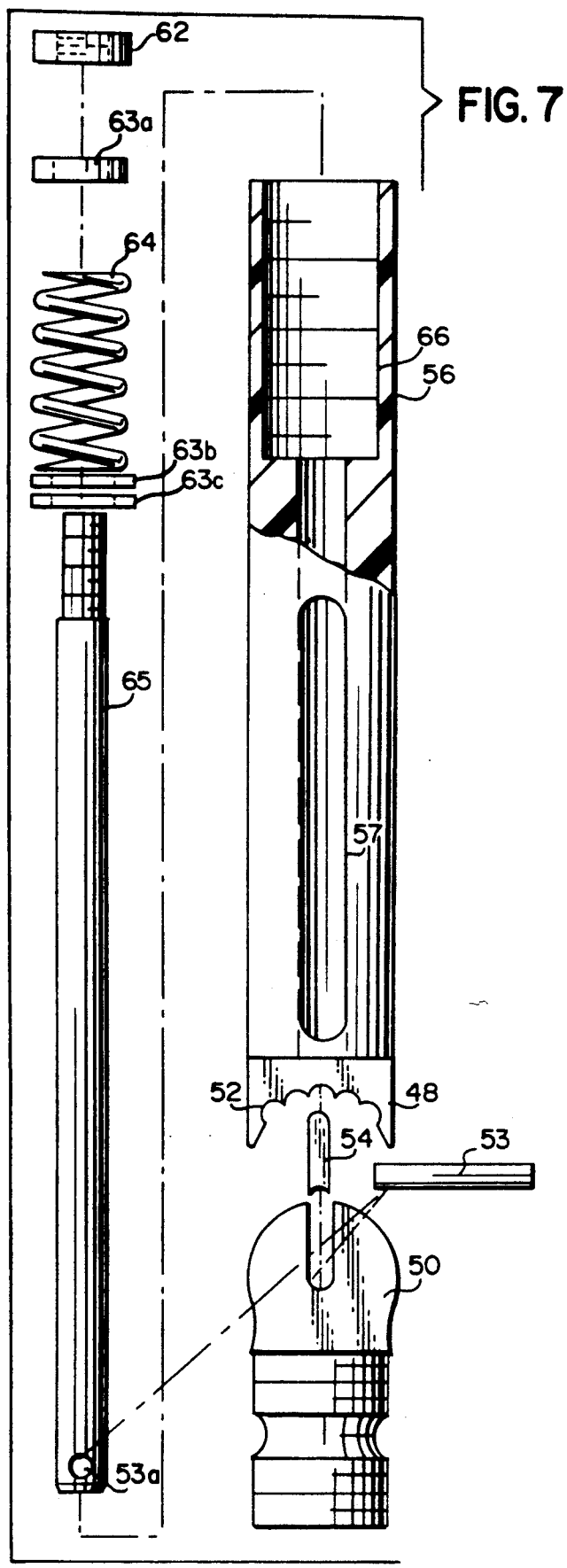
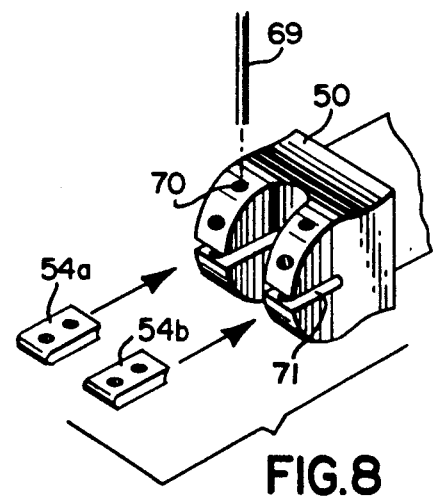
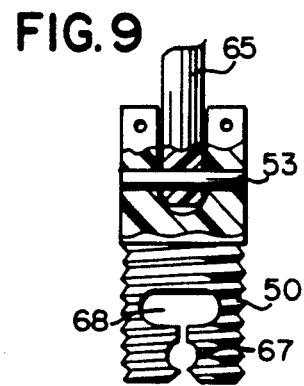

ADJUSTABLE HOLDERS FOR MAGNETIC REASONANCE IMAGING RF SURFACE COIL

FIELD OF THE INVENTION

The present invention relates to the field of magnetic resonance imaging (MRI) utilizing nuclear magnetic resonance (NMR) phenomena and, in particular, to an improved holder for accurately positioning and securing an MRI RF "surface coil" used to image the temporomandibular joint or other parts of the body.

BACKGROUND AND SUMMARY OF THE INVENTION

This application is generally related to earlier-filled, commonly-assigned patents and applications of Crooks et al, including U.S. Pat. Nos. 4,297,637; 4,318,043; 4,471,305; 4,599,565; 4,607,225; the pending application of Arakawa et al, Ser. No. 827,609, filed Feb. 10, 1985, now U.S. Pat. No. 4,695,801; pending application of Harrison et al., Ser. No. 827,638 filed Feb. 10, 1986, now U.S. Pat. No. 4,682,125; and the co-pending applications of Arakawa et al., Ser. No. 888,074 filed July 22, 1986, now U.S. Pat. No. 4,752,736 and of Fehn et al, Ser. No. 878,369, filed June 25, 1986 now U.S. Pat. No. 4,707,664. The contents of these related patents and applications are hereby incorporated by reference.

Magnetic resonance imaging (MRI) is now coming into widespread commercial usage. However, there are still many areas of MRI technology which need improving. One such area of improvement involves what is commonly referred to as an MRI "surface coil" convenient for accurate positioning arrangements (to examine, for example, anatomical areas of the head such as the temporomandibular joint and middle ear). MRI Surface coils of the variety used for imaging the temporomandibular joint offer distinct advantages over larger head or body coils for reasons well known in the art.

In imaging operations using an MRI RF surface coil, it is known that oblique surface coil imaging of the temporomandibular joint is an exacting procedure and requires very precise positioning and securing of the imaging device on the area being examined. It is also known that the surface coil should be oriented with its housing (sometimes referred to as a "pad") positioned directly next to the patient. Further, care should be taken to ensure that no gaps exist between the patient's face and the surface coil.

It is desirable that the MRI imaging device be positioned and tightly secured at an exact reproducible angle on the face, eye or other head part in order to obtain consistent and meaningful diagnostic data. Often, it is necessary to position the surface coil in a series of slightly different orientations in order to complete an effective examination. Thus, it is highly desirable to provide an ability to position and secure the coil in a precise and consistent manner. It may also be advantageous to position the surface coil in the same manner on different patients for purposes of comparative evaluation of different received images. It may also be necessary to repeat a particular surface imaging operation on the same patient (such as after treatment), thereby requiring that the surface coil be placed in substantially the same location and in the same orientation on the body part.

However, conventional holders for surface coils do not effectively permit such apparatus to be accurately positioned and secured in the different orientations required during an imaging operation. Typically, the surface coil is simply taped to the anatomical part to be examined. Further, the prior art methods and apparatus for imaging using an MRI RF surface coil have been incapable of orienting the surface coil such that it provides optimum signal-to-noise ratios. Prior art devices have also not been successful at duplicating an exact position of a previous imaging operation, nor have they been effective in duplicating positions on different patients.

The reader's attention is directed to the publications and patents discussed below as possibly relevant prior art:

| Inventor | U.S. Pat. No. | Date Issued |
| --- | --- | --- |
| Brown | 4,608,977 | September 2, 1986 |
| Patil | 4,592,352 | June 3, 1986 |
| Barbier et al | 4,465,069 | August 14, 1984 |
| Patil et al | 4,463,758 | August 7, 1984 |
| Perry | 4,341,220 | July 27, 1982 |
| Kopf et al | 4,256,112 | March 17, 1981 |
| Travis et al | 3,025,397 | March 13, 1962 |

The '977 patent to Brown discloses a tomography-related system in which a frame is fixed to the body part being examined and operates in conjunction with a CT scanner and display apparatus. The frame includes a holder for guiding the desired therapeutic instrument and structure for providing reference indications of the location of the therapeutic equipment.

The '352 patent to Patil concerns a computer-assisted tomography stereotactic system in which a pair of vertically-disposed support members are longitudinally movable and mounted at opposite sides of a platform having selectively and vertically movable carrier supports.

The '069 patent to Barbier et al discloses an apparatus whereby the head of the patient is held in place horizontally using an indexed sliding cradle for an X-ray scanner. A vertical ring encircles the head and includes rest supports behind the ears and behind the eyes at the cheekbone area. An adjustable, horizontally-projecting instrument support structure is mounted on an arcuate track in the ring between the head rests.

The '758 patent to Patil et al discloses a tomography stereotatic frame for use with a CT scanner which comprises a platform for support having an area for supporting the patient's head. An inverted, substantially U-shaped frame is movably mounted on the support. A "probe holder" is movably mounted on either of the leg portions of the frame to permit a drill or probe to be extended therethrough.

The '220 patent to Perry also relates to a stereotatic surgery frame which is fixed to the patient's anatomy. The frame defines a predetermined, three-dimensional coordinate system in which surgical devices may be precisely positioned.

The '112 patent to Kopf et al concerns a head positioner for radiological and other medical procedures in which the components are secured to form a unitary head band structure capable of repeated and periodic use in positioning the cranium of a human skull in precisely the same position relative to other medical equipment.

The '397 patent to Travis et al discloses skull radiography apparatus comprising a skull receiving tray which is pivotally mounted on a base plate about an axis parallel to the longitudinal axis of the tray. An "aligner rod" overlying the tray provides swinging movement about the tray axis. The '397 structure also includes means on the base plate indicating the angular position of the rod.

It has now been found that the various deficiencies associated with prior art devices and the methods for positioning and securing surface coils on desired anatomical areas such as the temporomandibular joint may be substantially alleviated by the apparatus and method according to the present invention.

In particular, the apparatus according to the invention provides four separate means for positioning and securing the MRI RF surface coil relative to the temporomandibular joint or other anatomical part being imaged. The exemplary apparatus according to the invention also provides means for positioning and securing the anatomical part itself (as opposed to adjustment of the surface coil), thereby providing fifth and sixth means for independently positioning and securing the coil in an exact orientation relative to the body part being examined.

In essence, the present invention includes an adjustable holder for magnetic resonance imaging comprising means for positioning and securing the imaging device at a first predetermined point along the longitudinal axis of the holder, together with means for positioning and securing the imaging device at a second predetermined point transverse to the longitudinal axis of the holder and at a radial distance R from the longitudinal axis. In this regard, those skilled in the art will recognize that the longitudinal axis of the surface coil holder will be parallel to, but not necessarily the same as, the true longitudinal axis (e.g. the "Z-axis") of the remainder of an MRI imaging system within which the surface coil operates.

The four independently adjustable positioning and securing means for the surface coil holder in accordance with the invention provide an operator with considerable flexibility in locating the coil at the exact desired position and orientation relative to the body part being examined.

First, means are provided whereby the surface coil holder may be positioned and secured at any point along the longitudinal axis of the holder using a pair of opposing "runner feet" which are slidably mounted to the holder base plate, thereby enabling the holder to move back and forth in a longitudinal direction. Second, a pair of parallel, generally U-shaped orientation guides transverse to the longitudinal axis (referred to herein as coil orientation "runner guides") allow for orbital movement of the surface coil to any desired radial point at a distance R from the longitudinal axis. Third, the surface coil can be adjusted by pivotal rotation of the coil about an axis which is substantially parallel to the longitudinal axis. Fourth, the coil can be moved radially inwardly and outwardly relative to the patient's head by way of an adjustable orientation arm operatively connected to clamping and adjusting means on the U-shaped runner guides.

The objective of using the above four independently adjustable positioning and securing means is to enable the operator to place the coil in an exact orientation flat against the body part to be examined during imaging.

In contrast to the above four means for positioning the MRI RF surface coil itself, the present invention also contemplates two separate means for positioning the body part to be examined. In particular, the support structure for the body part (such as the temporomandibular joint area of the head) may be rotated (and then secured) about an axis parallel to the longitudinal axis of the holder at an oblique angle of up to 45 degrees. A sixth means for positioning anatomical parts is accomplished by way of longitudinal, as opposed to rotational, adjustment of the support structure for the body part.

Thus, it is an object of the present invention to provide for an improved apparatus for imaging anatomical body parts such as the temporomandibular joint or middle ear using an RF MRI surface coil.

It is a further object of the present invention to provide and an improved holder for an MRI RF surface coil having means for adjustably positioning and securing the surface coil to an exact position and angle relative to the anatomical area to be imaged.

It is still a further object of the present invention to provide means for obliquely imaging the temporomandibular joint in a very exacting manner which can be documented and duplicated upon subsequent imaging operation.

These and other objects of the invention will become more clear following a review of the appended drawings, and detailed specification.

BRIEF DESCRIPTION OF THE DRAWINGS

FIG. 6 is an exploded perspective view of part of exemplary positioning and securing means in accordance with the invention;

FIG. 7 is an exploded perspective view further illustrating the positioning and securing means shown in FIG. 6;

FIG. 8 is a detailed perspective view of a portion of the positioning means depicted in FIG. 7;

FIG. 9 is a detail elevation view of the pivot head portion of the positioning means depicted in FIG. 8;

DETAILED DESCRIPTION OF THE DRAWINGS

The six independently adjustable means for positioning and securing an MRI RF surface coil as summarized above are described herein with reference to three directional axes. As used herein, the Z axis (also referred to herein as the "L" axis) is defined as the longitudinal axis of the coil holder depicted in FIG. 1 as item 10. Assuming that the holder is in its normal operating position with its assembly base plate (item 11 on FIG. 1), i.e. horizontal and enclosed by the remainder of an MRI imaging system with the patient lying horizontal, the Z axis passes through the center of the holder frame at a vertical distance R (the radius of curvature of the parallel runner guides 26 and 27 shown in FIG. 1) directly below the top (midpoint) of the runner guides. The longitudinal Z axis is therefore equidistant from the vertical side portions of runner guides 26 and 27.

Figure 2:
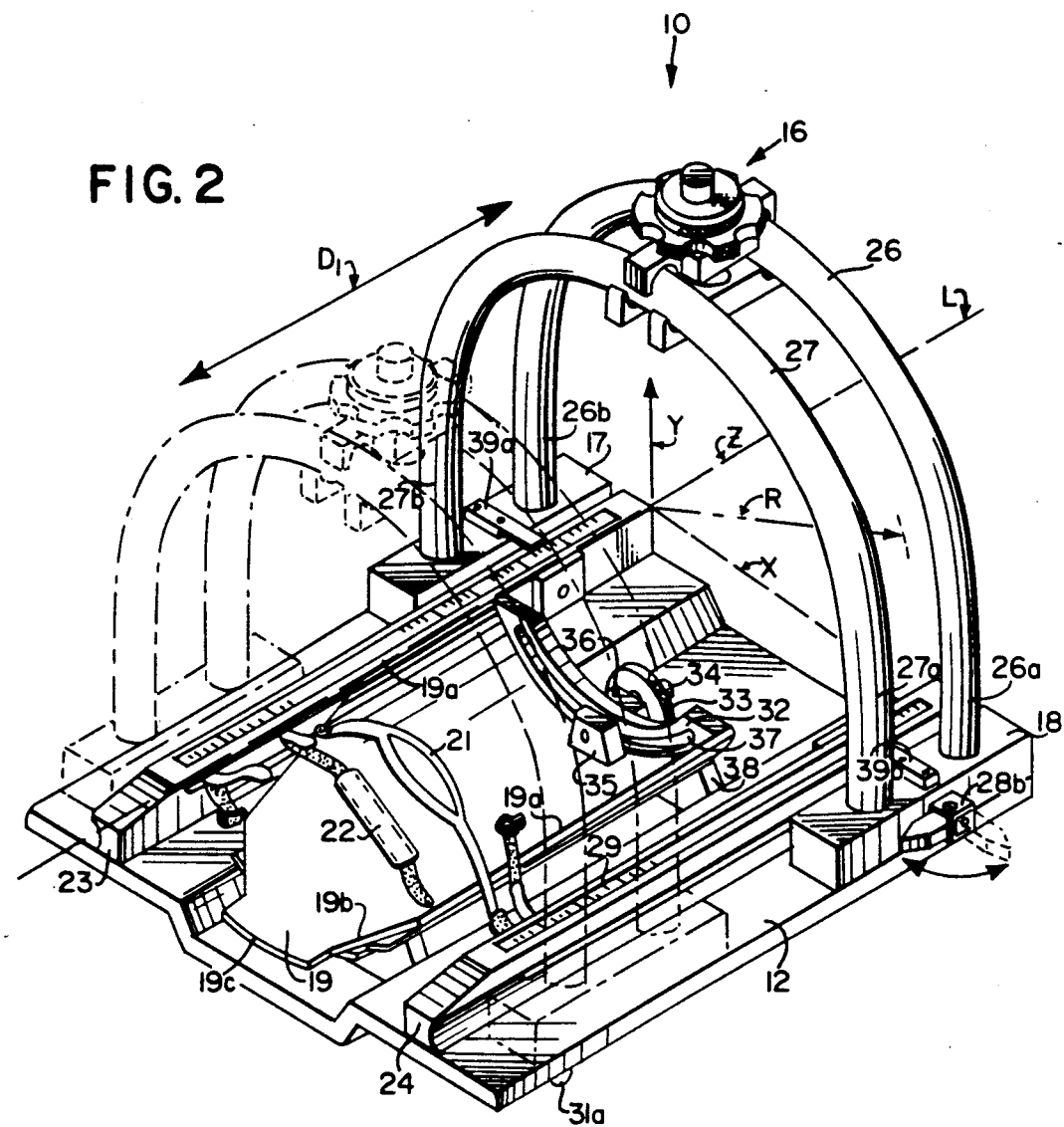
FIG. 2 is a perspective view of the MRI RF surface coil holder depicted in FIG. 1 but without the associated MRI RF surface coil and holder assembly base plate.

The X axis is defined as being perpendicular to the Z axis in a horizontal direction from a point on the Z axis exactly midway between the parallel paths defined by runner guides 26 and 27. The Y axis runs from the intersection of the X and Z axis in a vertical direction perpendicular to the Z axis. Thus, the means described herein for positioning and securing an MRI RF imaging device in accordance with the present invention involve two predetermined points—the first being a point along the longitudinal Z axis of the holder (see axis "L" in FIG. 2), and the second being a point in a plane transverse to the longitudinal axis as defined by the X and Y axes at a predetermined radial distance from the Z axis at a point along radial line "R " as shown in FIG. 2.

Figure 1:
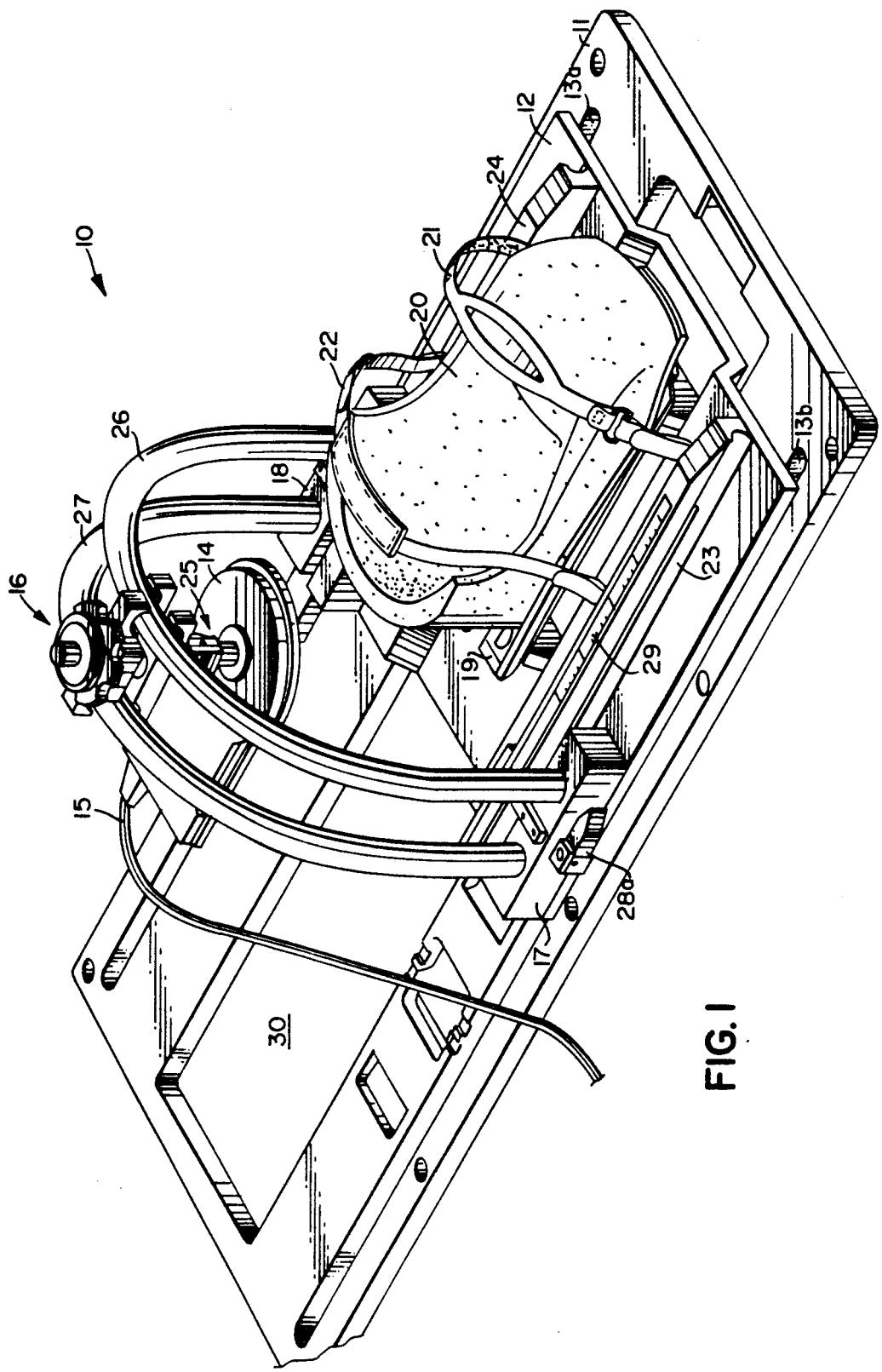
FIG. 1 is a perspective view of an exemplary surface coil holder in accordance with the present invention shown in its assembled and operative mode, i.e., in conjunction with an MRI RD surface coil and holder assembly base plate.

With particular reference to FIG. 1 of the drawings, an exemplary holder for positioning and securing an MRI RF surface coil 14 (operatively connected to cable 15) in accordance with invention is shown generally at 10. Holder 10 includes a recessed base plate 12 which is adjustably mounted on a Plexiglas TM assembly plate 11 which typically forms a permanent part of the patient bed. In its mounted position on assembly plate 11, holder 10 may be moved in a direction parallel to the longitudinal Z axis by virtue of a plurality of rounded vertical projections on the underside of base plate 12 (see items 31a and 31b in FIG. 4). Base plate 12 is slidably mounted in opposing longitudinal slots 13a and 13b of assembly plate 11 to thereby permit the entire holder to move within opening 30. Preferably, plate 11 will be initially positioned (e.g., by securing it to the patient bed) before any other adjustments are made to the position of surface coil 14 as described in detail below.

As FIG. 1 illustrates, the surface coil holder 10 in accordance with the invention includes six separate means for positioning the MRI RF surface coil 14 relative to the body part being examined, such as the temporomandibular joint or other areas of the human skull. As indicated above, four of those means serve to position and orient the surface coil itself, with the fifth being used to position the patient's head at a desired angle oblique to the longitudinal axis L of holder 10.

FIG. 1 shows, in general form, the four independently adjustable positioning and securing means, three of which are shown generally at 16 and allow the surface coil 14 to be positioned at a predetermined radial distance transverse to the longitudinal axis L of holder 10. In particular, the surface coil 14 may be moved along an orbital path about the longitudinal axis of the holder by way of a pair of parallel cylindrical U-shaped runner guides 26 and 27 which are fixedly secured to opposing runner feet 17 and 18. Coil positioning and securing assembly 16 also includes means for moving the surface coil inwardly and outwardly along a given radius transverse to the longitudinal axis, as well as means for rotating surface coil 14 in a step-wise manner about an axis generally parallel to the longitudinal axis by way of the pivoting means shown generally at 25.

The holder may be positioned at a predetermined point along the longitudinal axis by way of opposing runner feet 17 and 18 which are slidably mounted on holder base plate 12 and cooperate with runner rails 23 and 24, respectively, to allow for movement of holder 10 in either direction parallel to the longitudinal axis. Both runner rails 23 and 24 include corresponding identical position indicator markings 29 to facilitate accurate positioning of the holder along the Z axis. Once in the desired location, runner feet 17 and 18 may be locked into position using foot locks 28a and 28b (see FIG. 2).

The body part to be examined by be adjustably positioned relative to surface coil 14 by means of a head cradle 19 which slidably cooperates with a cradle support base (item 38 on FIG. 2) which in turn is fixedly secured to recessed holder base plate 12. The cradle support base 38 includes means as described below for rotating head cradle 19 up to 45 degrees about an axis parallel to the longitudinal Z axis. Means are also provided for securing the head cradle in the desired angular orientation. Cradle 19 may also be adjusted in a direction parallel to the longitudinal axis of the holder (see discussion of FIG. 2 below).

During imaging, the patient's head rests on a head support cushion 20 and may be secured into position prior to and during the imaging operation using chin strap 21 and forehead strap 22. As those skilled in the art will appreciate, the surface coil holder 10 in accordance with the invention is preferably used in MRI RF imaging operations relating to the head area. However, the holder could be adapted for other parts of the human body with only minor modifications in structure to, for example, the configuration of cradle 19. Further, those skilled in the art will recognize that all parts of the holder must be non-magnetic in construction using, for example, high density nylon or other rigid plastic material.

With particular reference to FIG. 2 of the drawings, the longitudinal axis L of holder 10 is defined at a distance R equal to the radius of curvature of the parallel cylindrical runner guides 26 and 27. Each of the runner guides is disposed transverse to axis L an has a radius of curvature R sufficient to provide clearance for the average human head, together with the associated surface coil imaging apparatus. The radial portion of each runner guide terminates in opposing downwardly projecting leg portions shown at 26a, 26b, 27a and 27b having the terminal ends thereof adjustably fixedly secured to runner feet 18 and 17, respectively.

FIG. 2 also shows in phantom the direction and amount of movement D for runner guides 26 and 27 along the longitudinal axis by way of slidably mounted runner feet 18 and 17 which, once in the desired position, may be locked into place by foot locks 28a and 28b. The exact desired position of each runner foot 17 and 18 may be determined by hairline indicators 39a and 39b secured to each foot with indicator markings 29 on runner rails 23 and 24 indicating the exact longitudinal position of the runner feet 17 and 18 relative to base plate 12.

FIG. 2 also illustrates exemplary means for orienting the patient's temporomandibular joint or other body part to be imaged relative to MRI RF surface coil 14 by adjustably rotating head cradle 19. Preferably, head cradle 19 has a curvilinear configuration which is open at the top and both ends thereof to define a trough-like support structure for the patient's head. The cradle 19 may be rotated through an angle of approximately 45 degrees about an axis which is substantially parallel to the longitudinal axis of holder 10. The radius of curvature of cradle 19 should be large enough to support and partially enclose the average human skull and deformable cushion head support 20. Preferably, cradle 19 also has a configuration in which the longitudinal side edge portion, e.g., side edge 19a, terminates in a downwardly sloping edge portion 19b, which in turn terminates in an arcuate end portion 19c sized to support the neck area of the patient.

Cradle 19 is supported by a cradle base support structure 38 which has a matching curvilinear configuration and is adjustably secured to holder base plate 12 by means of dowel pins (not shown) on the underside of each end of support 38 which engage one of two sets of dowel pin holes in assembly plate 11. The underside surface of head cradle 19 and the top surface of cradle support structure 38 define a conforming bearing surface for rotational movement of head cradle 19 against support 38. That is, cradle 19 slides freely within support base 38 about an axis which is parallel to the longitudinal axis of holder 10.

The adjustment and securing means for head cradle 19 include a calibrated vernier-like angle plate 32 which is rigidly secured to the rearward end of cradle 19. Angle plate 23 has an arcuate configuration and includes an elliptical opening or slot 37 in the center thereof having a radius of curvature slightly less than that of the head cradle itself. Angle plate 32 slidably engages threaded adjusting pin 34 which passes through pressure block 36 and slot 37 to be secured to pressure block 35 which in turn is slidably mounted on the top surface of cradle 19. Pressure block 35 may be biased in a direction toward arcuate angle plate 32 by turning adjusting and securing knob 33 in a clockwise direction.

Thus, in order to position head cradle 19 at a desired angle of orientation, adjusting knob 33 is first loosened to allow the cradle to be rotated about pivot pin 34. Knob 33 is then tightened causing pressure blocks 35 and 36 to press against opposite sides of vernier angle plate 32 and thereby lock the cradle into the desired position. The exact angle of rotation is determined by way of a location pointer and indicator marks on the top surface of angle plate 32 with the zero degree line being defined at the center of slot 37.

A sixth means of positioning anatomical parts is by way of the cradle adjustment along the longitudinal axis of the holder. Holder base plate 12 has two sets of dowel pin holes which allow the head cradle assembly to be positioned along the longitudinal axis in two fixed positions. Detachment is done by lifting the cradle assembly so that the dowel pins, which are fixedly secured to the bottom of cradle base support 38 will disengage from the dowel pin holes in base plate 12.

FIG. 2 also depicts the relative positions of chin strap 21 and forehead strap 22, which may be adjustably moved in a direction parallel to the longitudinal axis to accommodate an individual patient's head configuration. That is, straps 21 and 22 are slidably mounted within opposing adjusting slots (shown by way of example as 40 in FIG. 3) in the sides of runner rails 23 and 24. As FIG. 3 illustrates, adjusting slot 40 on the outside of runner rail 23 extends for a distance D2 to allow for the various desired positions for each holding strap.

Figure 3:
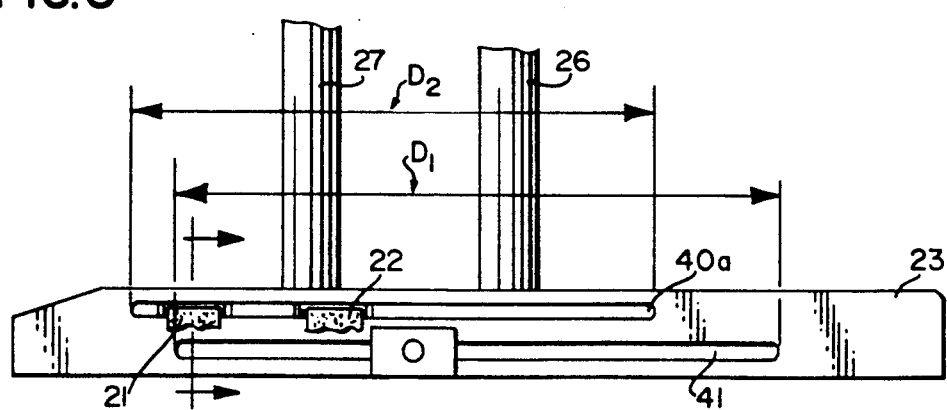
FIG. 3 is a partial elevation view of the "runner rail" portion of the holder depicted in FIG. 1.

FIG. 3 also shows one aspect of the means for adjusting the relative position of runner feet 23 and 24. Longitudinal slot 41 slidably cooperates with the runner foot adjusting and securing means discussed below with respect to FIG. 10.

Figure 4:
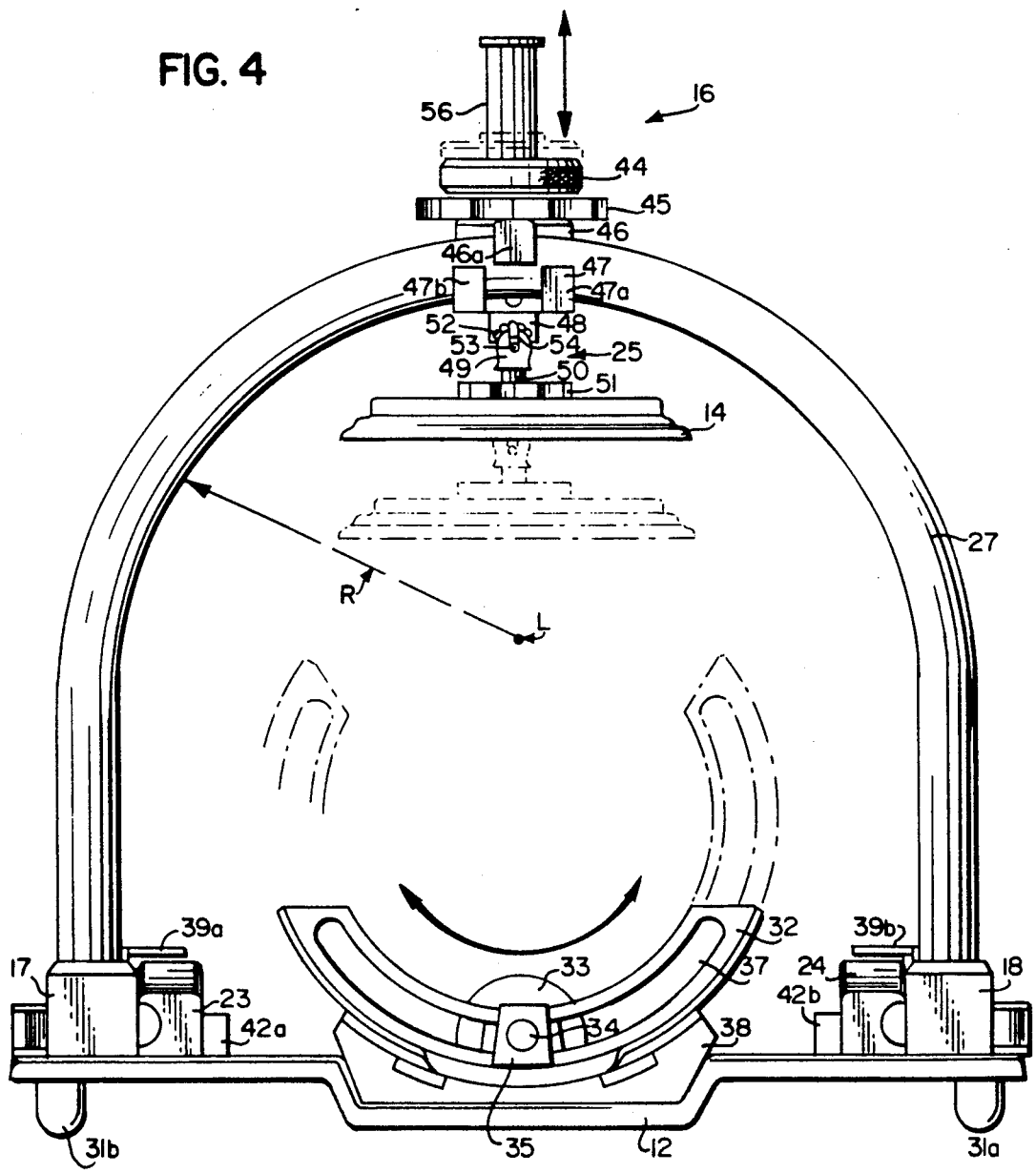
FIG. 4 is a front elevation view of the MRI RF surface coil holder depicted in FIG. 1 illustrating exemplary positioning and securing means for the surface coil, as well as exemplary means for positioning the patient's head within the coil holder.

FIG. 4 of the drawings shows in greater detail the surface coil orientation locking (securing) means depicted generally as item 16 in FIG. 1. The preferred positioning and securing means consists of two opposing upper and lower adjustable clamping jaws 46 and 47 which are slidably mounted to parallel runner guides 26 and 27. Split bottom clamping jaw 47 includes two parallel clamping arms 47a and 47b for clamping engagement with each parallel runner guide on its bottom surface thereof. Both clamping arms 46 and 47 thus have clamping surfaces with a radius of curvature matching the radius of curvature of the cylindrical runner guides (see also FIG. 6).

Top clamping jaw 46 has only a single clamping arm 46a for each parallel runner guide. Each side of arm 46 thus has an upwardly curving clamping surface, also with a radius of curvature matching the runner guides. Together, clamping jaws 46 and 47 slidably encase parallel runner guides 26 and 27 and, prior to tightening, allow the entire coil orientation securing means 16 to be moved in a orbital manner along the runners within a plane defined by the X and Y axis, i.e., transverse to the longitudinal axis of holder 10.

Clamping jaws 46 and 47 each have concentric openings therein sized to receive a cylindrical orientation arm 56 which may be moved inwardly and outwardly along an axis transverse to the longitudinal axis of the holder to thereby adjust the position of the surface coil at a prescribed radial distance from the longitudinal axis.

Figure 5:
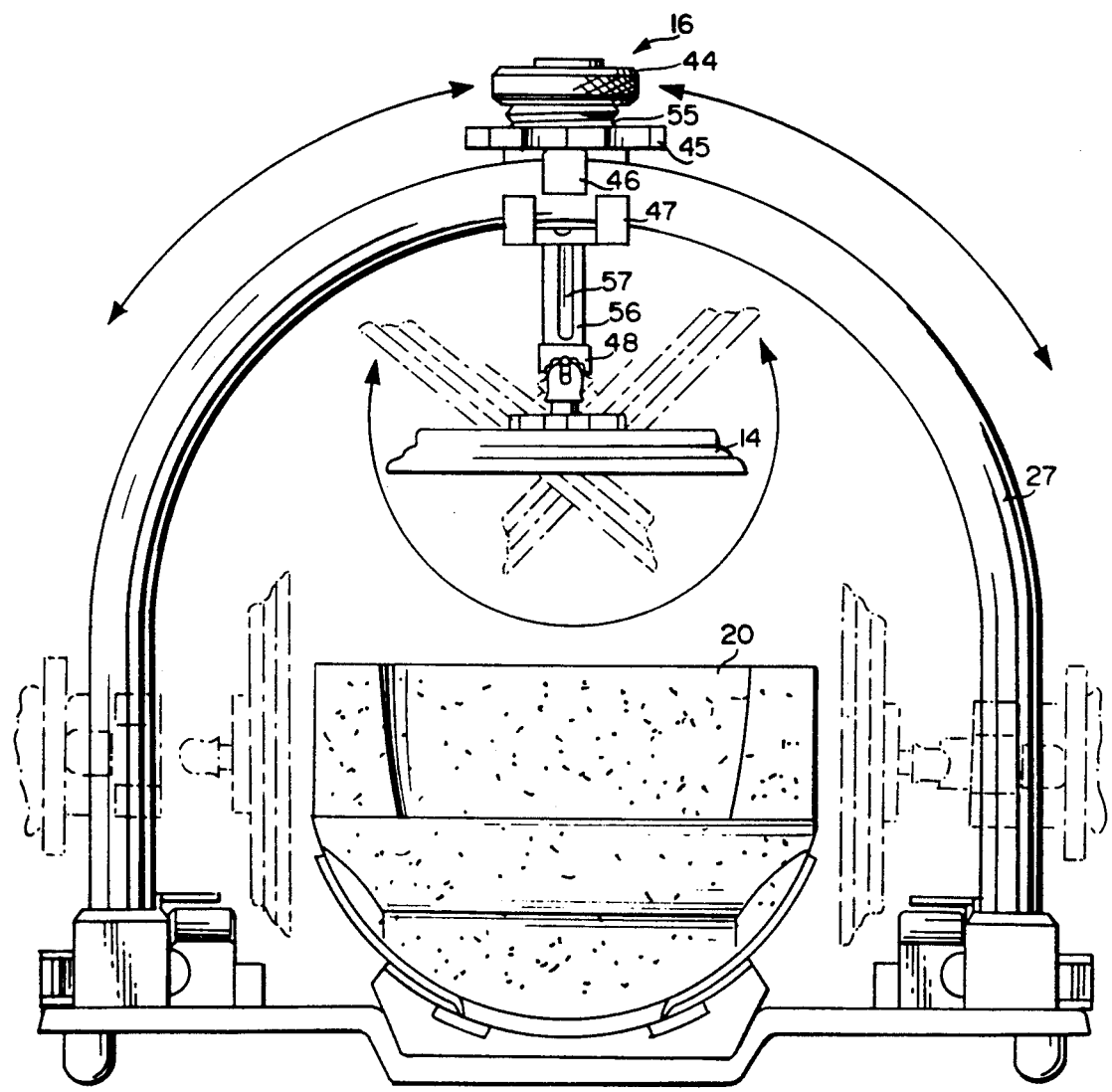
FIG. 5 is a front elevation view of the MRI RF surface coil holder device in FIG. 1 showing exemplary head support means useful with the invention and further illustrating exemplary surface coil positioning and securing means in accordance with the invention.

The coil orientation securing means 16 depicted on FIG. 4 includes first and second locking knobs 44 and 45, respectively, both of which threadably engage an orientation arm adjustment sleeve (see item 55 on FIG. 5 and item 60 on FIG. 6). The top orientation arm locking knob 44 serves to tighten cylindrical orientation arm 56 into the desired position, while locking knob 45 acts to clamp the clamping jaws 46 and 47 around the parallel runner guides.

FIGS 4, 5 and 6 of the drawings further illustrate the means for adjusting and securing surface coil 14 at a predetermined radial distance from the longitudinal axis. Adjustable orientation arm 56 slidably cooperates with sleeve 60 having a conical bearing surface which mates with an expandable and contractible conical collet or gripping wedge 59 disposed in the sleeve and surrounding orientation arm 56. Conical gripping wedge 59 is capable of being compressed due to the cutout portions along its longitudinal axis when locking knob 44 is turned in a clockwise direction. Cylindrical orientation arm 56 may thus be locked into the desired position by turning locking knob 44 in a clockwise direction which forces gripping wedge 59 into frictional engagement with orientation arm 56. Since conical wedge 59 and the conical surface of sleeve 60 are at slightly different angles, disengagement of conical wedge 59 from cylindrical orientation arm 56 will occur when locking knob 44 is turned counterclockwise.

Orientation arm 56 also includes a keyway 57 which cooperates with a key 80 in 60 (see FIG. 14) such that the movement upwardly and downwardly of orientation arm 56 occurs without any rotational movement. Orientation arm 56 is also prevented from extending below the top of locking nut 44 by way of flange cap 58 which is threadably secured to the top of the arm.

FIGS. 4, 5 and 6 also illustrate the means (shown generally as 25) for pivotally adjusting the position of MRI RF surface coil 14. Such means includes a pivot head 49 which rotates in a step-wise manner about acrylic pivot pin 53 which operatively connects pivot head 49 and cylindrical pivot rod 65 (see FIG. 7) disposed inside orientation arm 56 and resiliently biased upwardly by spring means 64. Pivot head 49 also includes a pair of opposing rigid detent-engaging fingers 54a and 54b (see FIG. 8) secured to each side of pivot head 49 which selectively engage one of a plurality of parallel detents 52 in the bottom surface of the upper pivot block 48. The detents 52 are arranged along an arc such that the step-wise engagement of fingers 54a and 54b results in a pivotal rotation of the MRI RF surface coil about 15 to 22 degrees relative to the longitudinal axis of orientation arm 56. The projecting end portions of the detent-engaging fingers have the same general configuration as the detents themselves.

In order to rotatably adjust the position of surface coil 14, the operator merely exerts a slight downward pressure to thereby rotate the coil 14 in a step-wise manner (from detent to detent) to the desired angular position. The top surface of pivot head 50 and the edges of fixed pivot mounting block 48 also define a bearing surface at the edges between the two components during rotation of the head.

FIG. 7 is the drawings depicts the preferred means by which the cylindrical pivot rod 65 may be resiliently biased upwardly. It also illustrates in greater detail the pivot head and means for providing step-wise adjustment of the MRI RF surface coil and shows exemplary means for providing releasably locking engagement between the surface coil and pivot adjustment means 25.

As FIG. 7 indicates, cylindrical pivot rod 65 is disposed inside orientation arm 56 and connects at the lower end thereof to pivot pin 53 which is mounted in cylindrical opening 53a via cylindrical opening 53A in pivot rod 65. The upper end of pivot rod 54 threadably engages spring support washer 63a which "floats" within a cylindrical bore section of orientation arm 56. Pivot rod 65 is resiliently biased upwardly by virtue of spring 64 which is compressed between spring support washer 63a and flat washers 63b and 63c which rest on the shoulder of cylindrical bore 66 within orientation arm 56 pivot rod 65 is threadably secured to nut 62.

FIG. 8 of the drawings shows an exploded view of pivot head 50 whereby the projecting detent-engaging fingers 54a and 54b are fixedly secured to corresponding slots in pivot head 50 by virtue of securing pins 69 via opening 70 in pivot head 50. Pivot head 50 may also preferably be made in one piece, such as a solid piece of nylon.

FIG. 9 depicts the lower portion of pivot head 50 showing the relative positions of cylindrical pivot rod 65 as connected to pivot pin 53. The bottom portion of pivot head 50 contains male threads for engagement with a threaded surface coil attachment knob 51 (see FIGS. 4 and 15) to thereby secure surface coil 14 to the entire pivot means 25. The lower threaded portion of pivot head 50 contains two openings, 67 and 68, respectively. Cylindrical opening 67 is sized to receive cylindrical securing pin 79 in surface coil 14 (see FIG. 14). Upper elliptical opening 68 facilitates the engagement of the securing pin into opening 67 at the time surface coil 14 is mounted to the pivot head, thereby allowing securing pin 79 to "snap fit" into opening 67 due to the inherent resilience of the plastic near the elliptical opening.

Exemplary means for positioning the MRI RF surface coil in a direction parallel to the longitudinal axis of the holder are depicted in FIGS. 10, 11, 12 and 13. Such means includes a pair of opposing block-like runner feet 17 and 18, each of which contains dual openings in the top to receive the terminal ends of runner guides 26 and 27. Each runner foot is capable of sliding movement along the top surface of holder base plate 12 by virtue of four small wheels (shown by way of example as 74a and 74b) disposed in slots 73a, 73b, 73c, and 73d which in turn are rotatably mounted to the feet by way of axles 75 and 76. Once assembled, the bottom portion of each wheel thereby extends below the bottom surface of the foot to contact the top surface of holder base plate 12.

Each runner foot also slidably engages a longitudinal runner rail (shown as 23 on FIG. 10) which is fixedly secured to holder base plate 12 see also FIG 2). Each runner foot operatively connects to slot 41a in the runner rail by virtue of a tension rod 71 disposed in openings within slot 41a and runner foot 17 and secured to foot lock mechanism 28a. Rectangular flange 42a which is rigidly secured to one end of tension rod 71 slidably engages the inside vertical surface of runner rail 23 for sliding movement as the runner foot 17 moves back and forth. In like manner, runner foot 17 engages runner rail 23 by virtue of a curved foot guide positioner 72, which engages a corresponding matching curved longitudinal slot 90 on the inside of runner rail 23. Tension rod 71 is secured to a foot lock mechanism 28a by way of screw 78 and sleeve 100.

Figure 10:
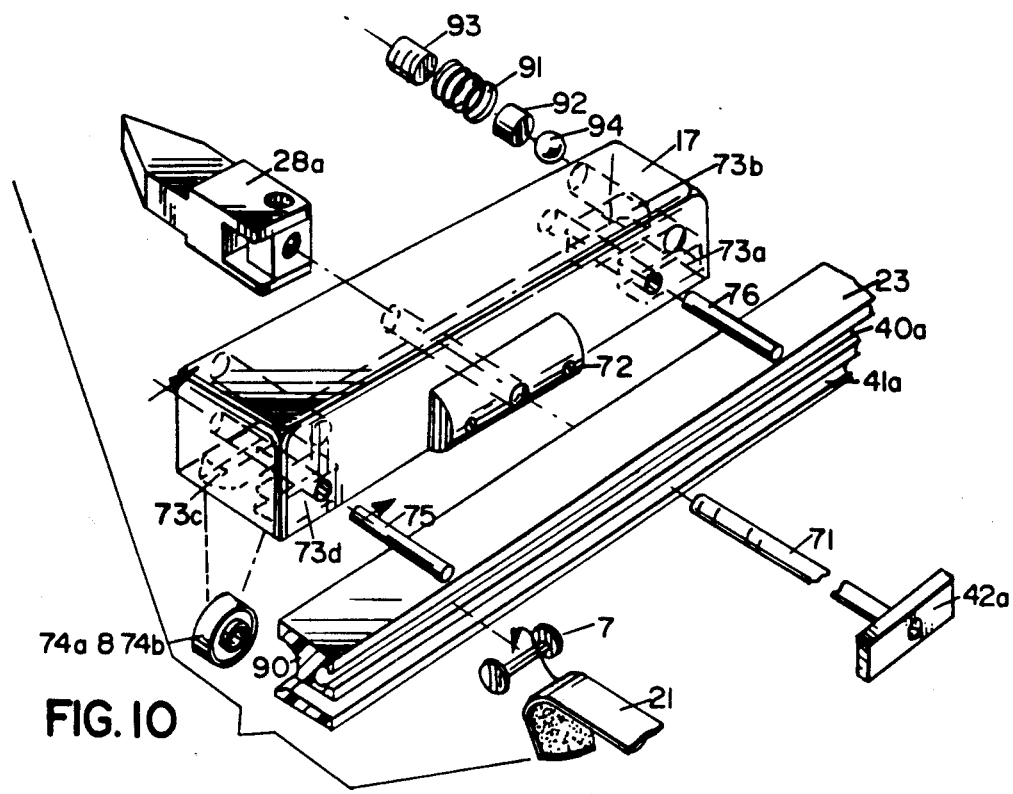
FIG. 10 is an exploded partial perspective view of the "foot locking" means and "runner foot" used to position the surface coil holder in a longitudinal direction in accordance with the present invention.
Figure 11:
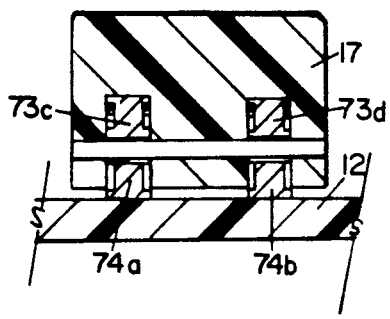
FIG. 11 is a partial cross-sectional view of an assembled runner foot depicted in FIG. 10.
Figure 13:
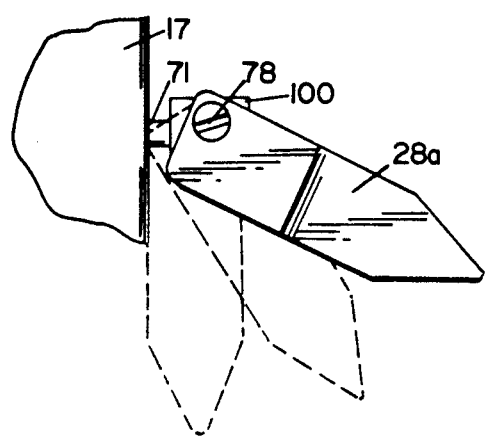
FIG. 13 is a partial elevation view of exemplary securing means for a runner foot in accordance with the present invention.

Foot lock mechanism 28a preferably consists of over-the-center (cam-like) pressure latch means as shown in FIGS. 10 and 13 which serves to compress the runner runner foot to its corresponding runner runner rail and thereby secure the foot at the desired position along the rail. A position indicator (item 39a on FIG. 2) is affixed to runner foot 17 and provided with a hairline 39b to facilitate fixing the position of the runner foot relative to each runner rail. Corresponding position indicator markings 29 are provided on the top surface of each runner rail.

In order to position each runner foot at a predetermined point along the runner rail the foot lock mechanism is loosened by moving its foot latch (item 28c on FIG. 13) in a direction away from the side of its corresponding foot runner in the manner depicted in FIG. 13. Once in position, the foot runner can be secured into position by turning foot latch 28c in the opposite direction thereby biasing the tension rod in a lateral direction and bringing foot runner 17 into frictional engagement with runner rail 23 along the matching curved surfaces defined by curved foot guide positioner 72 and longitudinal slot 90.

In an alternative embodiment of the runner foot 17 depicted in FIG. 10, it has been found that the sliding action of the runner foot at the point of bearing contact (positioner 72 and corresponding longitudinal slot 90) may be significantly improved by the use of two or more ball bearing assemblies disposed on each side of positioner 72. Each plastic ball bearing 94 is resiliently biased against the inside wall of runner foot 17 by way of spring means 91 which presses against the ball bearing via stop washing 92. The opposite end of spring means 91 abuts against a threaded plug 93. Thus, when the locking mechanism for the runner foot is loosened, each ball bearing makes bearing contact with top vertical planar surface of the runner rail 23 as the runner foot is moved into the desired position.

Figure 12:
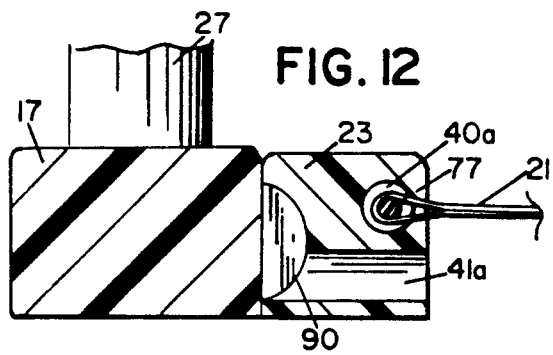
FIG. 12 is also a partial cross-sectional view of an assembled runner foot and runner rail shown in FIG. 10.

FIGS. 10 and 12 also depict the manner in which the chin and forehead straps 21 and 22 for the surface coil holder are slidably mounted in slot 40a of runner rail 23 by wrapping each strap around a flange-like pin 77 which is disposed in slot 40a for sliding engagement therewith.

Figure 14:
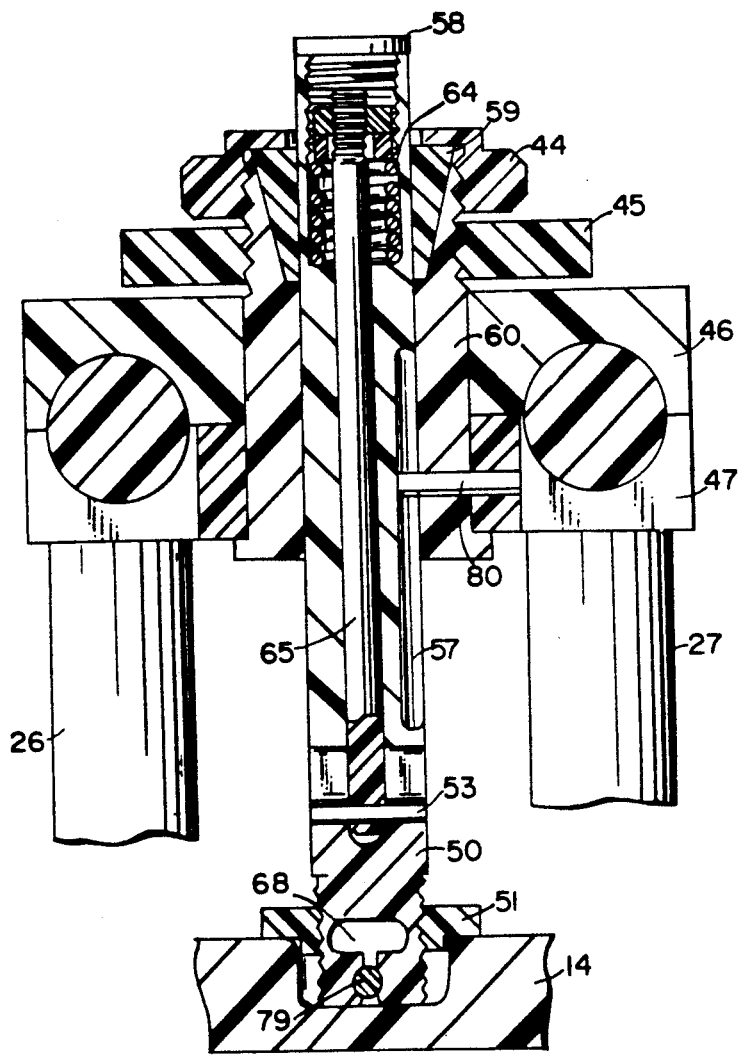
FIG. 14 is partial cross-sectional view of the assembled positioning and securing means depicted in FIG. 4.
Figure 15:
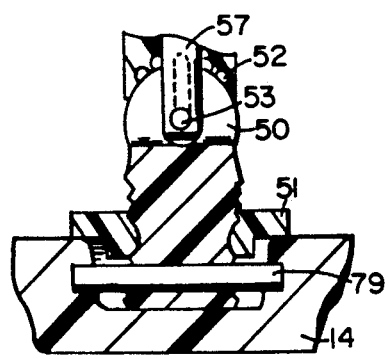
FIG. 15 is a partial cross-sectional view of the pivot head portion of the positioning means shown in FIG. 14.

FIG. 14 of the drawings shows a cross-sectional view of the assembled pivot means 25 in accordance with the invention attached to the surface coil 14 as discussed above. FIG. 15 similarly provides a detailed cross-sectional view of the pivot head 50 secured to the surface coil 14 by virtue of securing pin 79, also as discussed in detail above.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An adjustable holder for a magnetic resonance imaging RF surface coil for imaging a body part, said holder comprising
   first adjusting means for allowing movement of said magnetic resonance imaging RF surface coil to a first predetermined point along a longitudinal axis of said holder, said first positioning means consisting essentially of
   (a) means for allowing orbital movement of said magnetic resonance imaging RF surface coil about said longitudinal axis;
   (b) means for allowing movement of said magnetic resonance imaging RF surface coil along a path transverse to said longitudinal axis to a predetermined radial distance from said longitudinal axis; and
   (c) means for allowing pivotal movement of said magnetic resonance imaging RF surface coil in a step-wise manner about an axis substantially parallel to said longitudinal axis; and
   second adjusting means for allowing movement of said holder in a direction parallel to said longitudinal axis to said second predetermined point.

2. An adjustable holder according to claim 1 further comprising third adjusting means adapted for allowing movement of said body part along an axis substantially parallel to said longitudinal axis for imaging said body part at an angle oblique to said magnetic resonance imaging RF surface coil.

3. An assembly to allow preselected orientation of a magnetic resonance imaging RF surface coil adjacent a portion of a body part to be imaged, said assembly comprising:
   a magnetic resonance imaging RF surface coil;
   first adjusting means for allowing movement of said magnetic resonance imaging RF surface coil to a first predetermined point along a longitudinal axis of said holder;
   second adjusting means for allowing movement of said magnetic resonance imaging RF surface coil to a second predetermined point along an arc within a plane transverse to said longitudinal axis; and at a radial distance R from said longitudinal axis; and
   third adjusting means for allowing radial movement of said magnetic resonance imaging RF surface coil towards and away from said first predetermined point within said transverse plane to thereby position said magnetic resonance imaging RF surface coil for imaging a body part.

4. An assembly to allow preselected orientation of a magnetic resonance imaging RF surface coil adjacent a portion of a body part to be imaged, said assembly comprising:
   a magnetic resonance imaging RF surface coil;
   means for allowing movement of said magnetic resonance imaging RF surface coil to a first predetermined point along a longitudinal axis of said holder;
   means for allowing movement of said magnetic resonance imaging RF surface coil to a second predetermined point transverse to said longitudinal axis and at a radial distance R from said longitudinal axis; and
   means for allowing movement of said body part to thereby contact said body part with said magnetic resonance imaging RF surface coil.

5. An adjustable holder according to claim 4 further comprising fourth adjusting means adapted for allowing rotation of said body part about said longitudinal axis for imaging said body part at an angle oblique to said magnetic resonance imaging RF surface coil.

6. An adjustable holder according to claim 5 wherein said fourth means adapted for adjusting rotating said body part comprises a cradle adapted for supporting said body part, means being in cooperative engagement with said cradle to thereby define a conforming bearing surface for sliding movement of said cradle, and means for rotating and securing said cradle to position said cradle at an angle oblique to said RF surface coil.

7. An adjustable holder according to claim 4 further comprising means for securing said magnetic resonance imaging RF surface coil at said first and second predetermined points during imaging of said body part.

8. An adjustable holder according to claim 7, wherein said means for securing said magnetic resonance imaging RF surface coil at said second predetermined point comprises a pair of upper and lower clamping jaws, an adjustable arm connecting said clamping jaws and said magnetic resonance imaging RF surface coil, and means for tightening said clamping jaws to secure said adjustable arm and fix the position of said magnetic resonance imaging RF surface coil at a predetermined radial distance from said longitudinal axis.

9. An adjustable holder according to claim 4, wherein said third adjusting means further comprises means for allowing pivotal movement of said magnetic resonance imaging RF surface coil in a step-wise manner about an axis substantially parallel to said longitudinal axis.

10. An adjustable holder according to claim 9, wherein said means for allowing pivotal movement of said magnetic resonance imaging RF surface coil comprises a pivot head secured to said magnetic resonance imaging RF surface coil, a pivot block for cooperative engagement with said pivot head and having a plurality of equally spaced detents, means for biasing said pivot head in a direction away from said magnetic resonance imaging RF surface coil, and detent engagement means for causing said pivot head to selectively engage one of said detents for rotation of said pivot head about an axis substantially parallel to said longitudinal axis.

11. An adjustable holder according to claim 9, wherein said means for moving said holder in a direction parallel to said longitudinal axis comprises an assembly plate, said assembly plate having a pair of opposing longitudinal slots, a pair of opposing runner feet slidably engaged with respective ones of said opposing longitudinal slots in said assembly plate, for movement in a direction parallel to said longitudinal axis.

12. An adjustable holder according to claim 4, wherein said second adjusting means comprises a pair of U-shaped runner guides disposed substantially transverse to said longitudinal axis, and adjustable clamping means in cooperative engagement with said runner guides for clamping and securing said magnetic surface resonance engaging RF surface coil to said runner guides.

13. An adjustable holder according to claim 4, wherein said third adjusting means comprises an adjustable shaft secured to said RF surface coil, adjusting means for moving said shaft and said RF surface coil inwardly and outwardly relative to said longitudinal axis, and clamping means in cooperative engagement with said adjustable shaft for clamping and holding said adjustable shaft.

14. An assembly adapted to preposition a non-invasive imaging elements at a selected angular orientation relative to a body part to be imaged by means of said imaging element, said assembly comprising:
   a non-invasive imaging element;
   a holder including orientation arm means for holding said non-invasive imaging element and for allowing movements of said imaging element relative to a body part so that said imaging element assumes a selected radial position relative to said body part; and
   mounting means for mounting said imaging element to a distal end of said orientation arm means, wherein said mounting means includes,
   (i) a pivot mounting block fixed to said orientation arm distal end;
   (ii) a pivot head coupled to said imaging element; and
   (iii) pivot coupling joining said pivot mounting block and said pivot head to allow relative pivotal movements therebetween so that said imaging element may be moved pivotally relative to said orientation arm means and thereby assume a selected one of a number of possible angular orientations relative to said body part to be imaged; and wherein,
   said pivot coupling means includes:
   (a) surface defining means positioned with one of said pivot mounting block and said pivot head for defining an arcuate engagement surface between said pivot mounting block and said pivot head when said surface coil is in said one possible angular orientation, and for defining a number of arcuately spaced-apart detent surfaces each of which establishes a respective one of said number of possible angular orientations of said surface coil; and
   (b) detent-engageable finger means positioned with the other of said pivot mounting block and said pivot head for being releasably seated within a selected one of said detent surfaces and thereby to cause said surface coil to releasably assume said selected one of said number of possible angular orientations relative to said body part to be imaged.

15. An assembly as in claim 14, wherein said mounting means includes biasing means for exerting a bias force in an engagement direction which causes said detent-engageable finger means to be seated within said selected one of said detent surfaces, and yet allows said detent-engageable finger means to be released from said selected one of said detent surfaces in response to a separation force in a separation direction, opposite to said engagement direction, being exerted thereupon so as to permit said relative pivotal movement to occur between said pivot mounting block and said pivot head.

16. An assembly to allow preselected orientation of a magnetic resonance imaging RF surface coil adjacent a portion of a body part to be imaged, said assembly comprising:
   a magnetic resonance imaging RF surface coil;
   cradle support means adapted for supporting said body part during a magnetic resonance imaging procedure; and
   surface coil holder means for (a) allowing positioning of said surface coil relative to said body part portion so as to achieve a selected orientation of said surface coil relative to said body part portion prior to said magnetic resonance imaging procedure, and (b) maintaining said selected orientation of said surface coil during said magnetic resonance imaging procedure, whereby said body part portion is imaged, wherein said surface coil holder means includes,
   (i) runner guide means for establishing at least a segment of an orbital path about said cradle support means;
   (ii) an elongate orientation arm having distal and proximate ends;
   (iii) coupling means which couples said proximal end of said orientation arm to said runner guide means for (1) allowing said orientation arm to be moved orbitally along said orbital path established by said runner guide means so that said orientation arms assumes a radial position along said oribital path which is aligned with said body part portion to be imaged, (2) allowing said orientation arm to be moved rectilinearly when in said radial position towards and away from said body part portion so as to permit said distal end thereof to be moved closer to and farther from, respectively, said body part portion and to thereby effect selected spaced radial positioning of said orientation arm distal end relative to said body part portion to be imaged, and (3) releasably locking said orientation arm proximal end to said runner guide means to maintain said radial position of said orientation arm along said oribital path, and to maintain said selected spaced radial positioning of said orientation arms distal end relative to said body part portion to be imaged; and (iv) mounting means connected to said orientation arm distal end for mounting said surface coil thereto, whereby said selected radial positioning of said orientation arm distal end causes said surface coil to assume said selected orientation thereof adjacent said body part portion to be imaged.

17. An assembly as in claim 16, wherein said mounting means includes:

a pivot mounting block fixed to said orientation arm distal end;

a pivot head coupled to said surface coil; and pivot coupling means joining said pivot mounting block and said pivot head to allow relative pivotal movements therebetween sao that said surface coil may be moved pivotally relative to said orientation arm and thereby assume a selected one of a number of possible angular orientations relative to said body part portion to be imaged.

18. As assembly as in claim 17 wherein said pivot coupling means includes:

surface defining means positioned with one of said pivot mounting block and said pivot head for defining an arcuate engagement surface between said pivot mounting block and said pivot head when said surface coil is in said one possible angular orientation, and for defining a number of arcuately spaced-apart detent surfaces each of which establishes a respective one of said number of possible angular orientations of said surface coil when said pivot head engages said pivot block; and detent-engageable finger means associated with the other of said pivot mounting block and said pivot head for being releasably seated within a selected one of said detent surfaces and thereby to cause said surface coil to releasably assume said selected one of said number of possible angular orientations relative to said body part portion to be imaged.

19. An assembly as in claim 18, wherein said mounting means includes biasing means for exerting a bias force in an engagement direction which causes said detent-engageable finger means to be seated within said selected one of said detent surfaces, and yet allows said detent-engageable finger means to be released from said selected one of said detent surfaces in response to a separation force in a separation direction, opposite to said engagement direction, being exerted thereupon so as to permit said relative pivotal movement to occur between said pivot mounting block and said pivot head.

* * * * *